United States Patent [19]
Kikuchi et al.

[11] Patent Number: 5,381,369
[45] Date of Patent: Jan. 10, 1995

[54] NONVOLATILE SEMICONDUCTOR MEMORY DEVICE USING A COMMAND CONTROL SYSTEM

[75] Inventors: Shinichi Kikuchi; Kiyotaka Uchigane, both of Yokohama; Hideo Kato, Kawasaki, all of Japan

[73] Assignee: Kabushiki Kaisha Toshiba, Tokyo, Japan

[21] Appl. No.: 191,334

[22] Filed: Feb. 3, 1994

[30] Foreign Application Priority Data

Feb. 5, 1993 [JP] Japan .................. 5-018277
Jan. 17, 1994 [JP] Japan .................. 6-003143

[51] Int. Cl.6 .................................. G11C 7/00
[52] U.S. Cl. .................. 365/189.01; 365/195; 365/218; 365/230.03
[58] Field of Search .............. 365/189.01, 218, 195, 365/196, 230.03

[56] References Cited

U.S. PATENT DOCUMENTS

| | | | |
|---|---|---|---|
| 5,097,445 | 3/1992 | Yamauchi | 365/195 |
| 5,124,946 | 6/1992 | Takahashi | 365/195 |
| 5,245,572 | 9/1993 | Kosonocky et al. | 365/218 X |
| 5,287,317 | 2/1994 | Kobayashi et al. | 365/218 |
| 5,313,429 | 5/1994 | Chevallier et al. | 365/218 X |
| 5,325,499 | 6/1994 | Kummer et al. | 365/195 X |

FOREIGN PATENT DOCUMENTS 2270196 11/1990 Japan .

*Primary Examiner*—Eugene R. LaRoche
*Assistant Examiner*—Son Dinh
*Attorney, Agent, or Firm*—Spensley Horn Jubas & Lubitz

[57] ABSTRACT

A nonvolatile semiconductor memory device using a command control system comprises a protect cell composed of a nonvolatile memory cell, a protect sense amplifier circuit for reading the data from the protect cell, a high-voltage sensing circuit for supplying a voltage during a programmed operation such as a writing or an erasing operation, a protect control circuit for controlling the protect cell, and a control circuit for reading the data from the protect cell and according to the read-out data, controlling the command to the memory cell array.

10 Claims, 11 Drawing Sheets

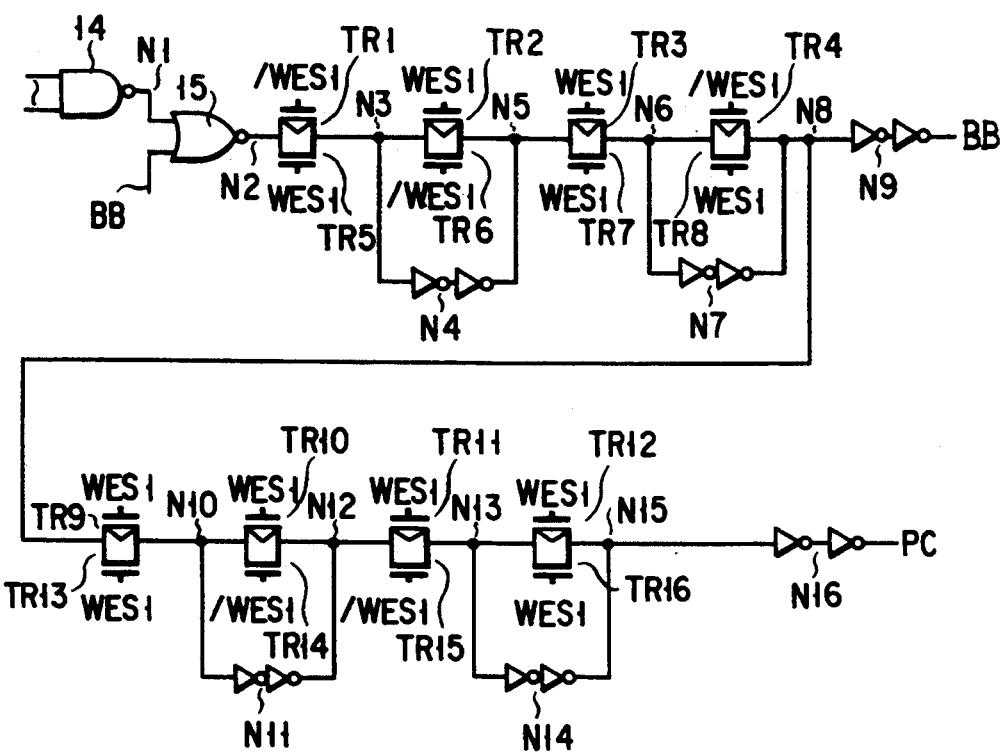
F I G. 4

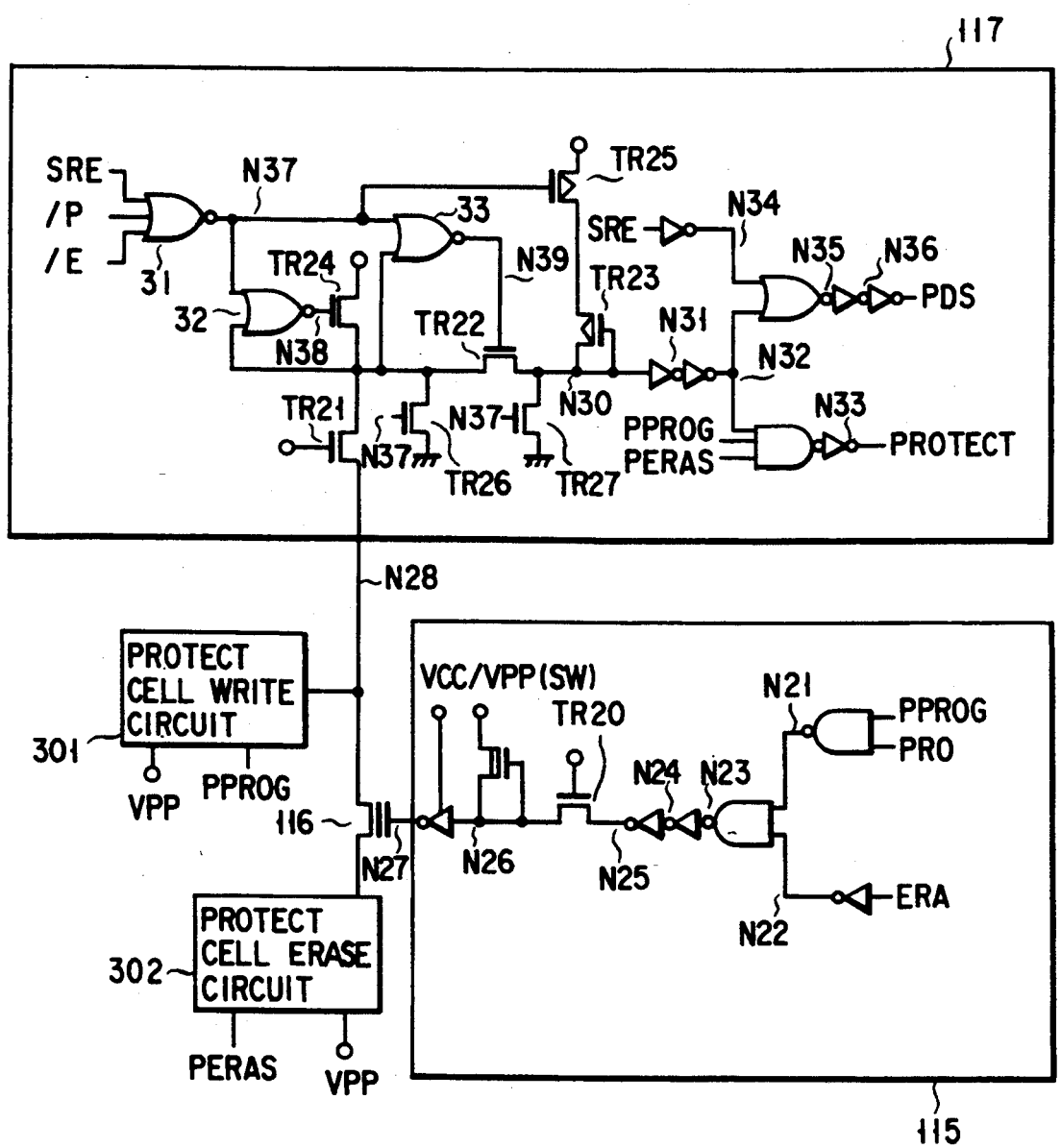
F I G. 11

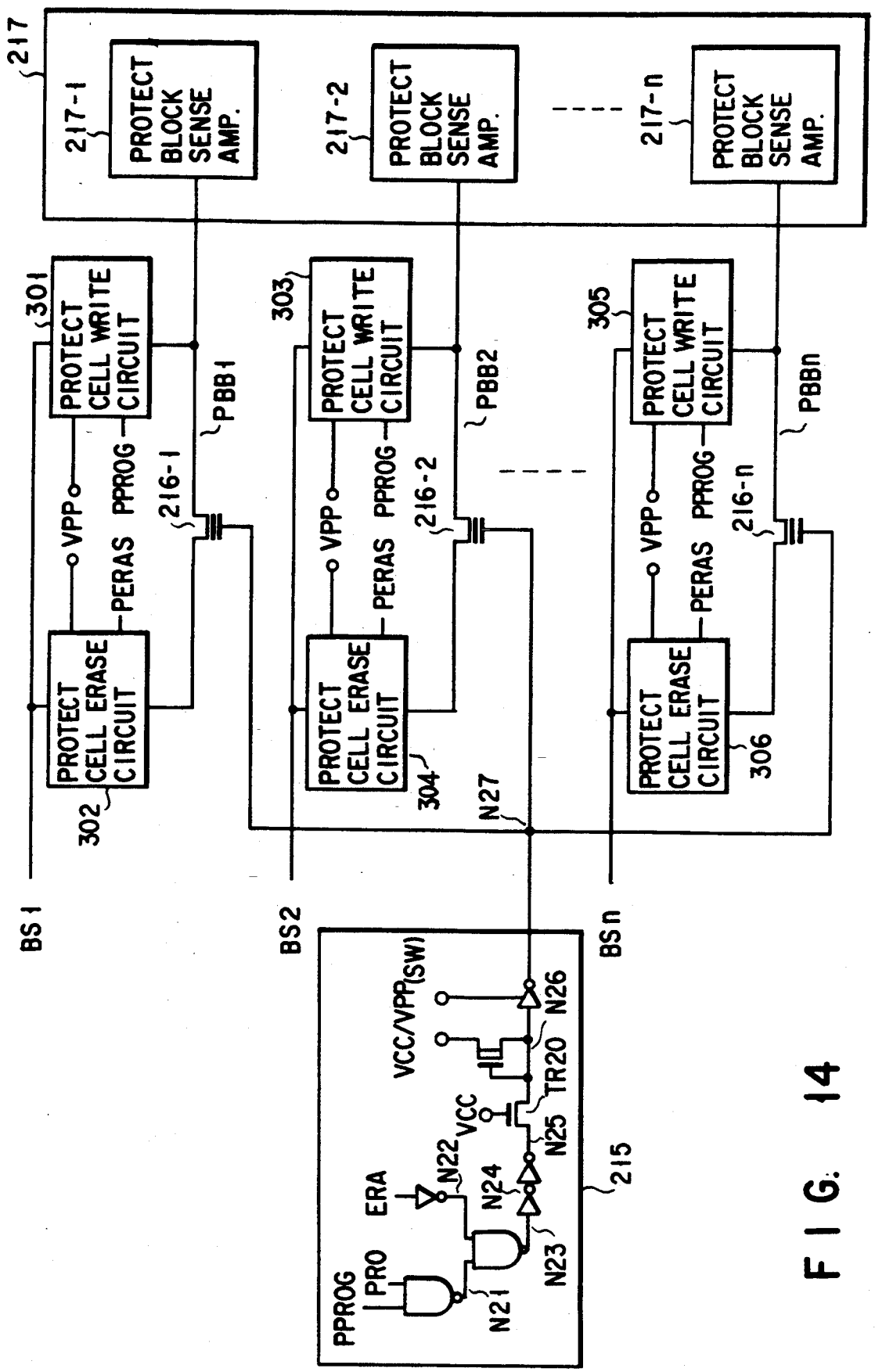
F I G. 14

NONVOLATILE SEMICONDUCTOR MEMORY DEVICE USING A COMMAND CONTROL SYSTEM

BACKGROUND OF THE INVENTION

1. Field of the Invention

This invention relates to a semiconductor memory device, and more particularly to a nonvolatile semiconductor memory device using a command control system.

2. Description of the Related Art

A flash EEPROM (Electrically Erasable programmable Read Only Memory) is one of nonvolatile memories that can be electrically written into and erased from. The configuration of a memory cell made up of a floating-gate MOS transistor in a flash EEPROM and general writing and erasing means will be described with reference to FIGS. 1 and 2.

FIG. 1 is a plan view of a memory cell portion of a floating-gate MOS transistor, and FIG. 2 is a sectional view taken along line 2—2 of FIG. 1. The floating gate MOS transistor contains a stacked gate electrode 506 composed of a thin gate insulating film 502 on a semiconductor substrate 501, a polysilicon floating gate 503 on the insulating film, a gate insulating film 504 on the gate, and a polysilicon control gate 505 on the insulating film 504. By implanting ions using the gate electrode 506 as a mask, a source diffused layer 507 and a drain diffused layer 508 are formed at the surface of the substrate 501. Numeral 509 indicates a drain contact and 510 denotes an element isolating insulating film.

Generally, writing is effected by applying a voltage of 6 to 7 V to the drain diffused layer 508 and a high voltage of nearly 12 V to the control gate electrode 505. This causes hot electrons generated by avalanche breakdown near the drain to be injected into the floating gate 503 via the gate insulating film 502. As a result, the threshold value of the memory cell rises, completing the write operation.

Erasing is performed by placing the control gate 505 at the ground voltage and the drain portion 508 in an open state, and applying a high voltage to the source portion 507 to discharge the electrons injected into the floating gate 503 by a method called the Fowler Nordheim tunneling, thereby lowering the threshold value of the memory cell.

One known method of controlling the writing or erasing operation as mentioned above is a method called a command control system in which the data in the memory cells are controlled by selecting and executing an operation mode according to the signal from an external microprocessor (MPU) or the like.

In the case of the command control system, the chip basically comprises a section for receiving a control signal externally supplied, a section for deriving a command from the signal, and a section for writing, reading, or erasing data into or from the memory cells. The configuration of a conventional chip using this system will be described with reference to a block diagram shown in FIG. 3.

The chip of FIG. 3 comprises these blocks: they are an address buffer circuit 1, an address latch circuit 2, a column decoder circuit 3, a row decoder circuit 4, a column gate 5, a memory cell array 6, a command register circuit 7, a control circuit 8, a sense amplifier circuit 9, a data latch circuit 10, an input/output buffer circuit 11, a write voltage circuit 12, and an erase voltage circuit 13. The direction of the arrow going in and out of each block represents the exchange of signals.

The operation of writing data in a memory cell of the memory cell array 6 according to a command will be explained, referring to FIGS. 3 to 5. FIG. 4 is a circuit diagram of the command register circuit 7 of FIG. 3. FIG. 5 shows waveforms related to the operation of the command register 7.

First, a specific write command has been transferred from external signals $I/O_0$ to $I/O_n$ to the input/output buffer circuit 11, and the external control signals /CE (/ means an inverted signal) and /WE externally supplied (e.g., an MPU) are at a high level (hereinafter, abbreviated as "H"). In this state, the chip is in a waiting state.

When the external control signals /CE and /WE go from a high to a low level (hereinafter, abbreviated as "L"), the inside of the chip becomes active. Then, according to the specific write command, given ones of signals $D_0C$ to $D_nC$ and $/D_0C$ to $/D_nC$ are transferred from the input/output buffer circuit 11 to the command register circuit 7.

Of the internal control signals WES1 and /WES1 obtained by shaping the external control signal /WE, WES1 is "H" and /WES1 is "L".

Part of the operation of the command register circuit 7 as well as a writing operation will be described with reference to FIG. 4. Accordingly, FIG. 4 is treated as a write command register. A NAND circuit 14, using given ones of signals $D_0C$ to $D_nC$ and $/D_0C$ to $D_nC$ as gate inputs, has only "H" ones of signals $D_0C$ to $D_nC$ and $/D_0C$ to $/D_nC$ connected to the gate upon arrival of the write command. For instance, if a combination of "H" external signal $IO_0$, "L" $IO_1$, "L" $IO_2$, and "H" $IO_3$ represents the write command, only gate input signals $D_0C$, $/D_1C$, $/D_2C$, and $D_3C$ are connected to the gate of the NAND circuit 14. Namely, the NAND circuit 14 is constructed so that all of its gate input signals may not be "H" even if a command other than the write command is externally supplied.

Therefore, when a write command is supplied, the output node (hereinafter, abbreviated as N) N1 of the NAND circuit 14 goes to a "L" level. Because node BB is "L" at the start of power supply, or in the initial state, the output N2 of a NOR circuit 15 in the next stage goes "H". A p-channel MOS transistor TR1 one end and the other end of which are connected to N2 and N3, respectively, and whose gate is supplied with signal /WES1, and an n-channel MOS transistor TR5 one end and the other end of which are connected to N2 and N3 respectively, and whose gate is supplied with signal WES1 becomes conductive, and N3 goes "H" as N2 does.

The output N4 of an inverter circuit using the N3 as an gate input goes "L", causing the output N5 of an inverter circuit using N4 as an gate input to go to a "H" level. At this time, p-channel MOS transistors TR2 and TR3 and n-channel MOS transistors TR6 and TR7 are nonconductive. However, because p-channel MOS transistors TR2 and TR3 and n-channel MOS transistors TR6 and TR7 were conductive in the initial state, the signal at N6 is "L", that at N7 is "H". As a result, the output N8 of an inverter circuit using N7 as an gate input is at a "L" level. Consequently, the output N9 of an inverter circuit using N8 as an gate input is "H", placing the output node BB of an inverter circuit using N9 as an gate input at a low level.

Since the arrangement of a subsequent-stage register connected to N8 is the same as that mentioned above, its explanation will be omitted. Here, because the signal at N8 is "L", that at N10 is "L", which places N11 at a "H" level, thus making the signal at N12 "L". This places N13 at a "L" level, which brings N14 to a "H" level, thus making the signal at N15 "L". Therefore, the output N16 of an inverter circuit using N15 as an gate input goes "H", thereby making the program control signal PC passing through an inverter circuit goes "L".

Next, when external control signals /CE and /WE go from "L" to "H", transistors TR1 and TR5 become nonconductive this time. In contrast, since transistors TR2, TR3, TR6, and TR7 become conductive, the signal at N6 goes "H" and that at N7 goes "L", with the result that the output N8 of the inverter circuit using N7 as an gate input goes "H" . This causes the signal at N9 to go "L" and signal BB to go "H", which resets the output N2 of a NOR circuit 15 using signal BB as an gate input to a "L" level. Because a p-channel MOS transistor TR9 and an n-channel MOS transistor TR13 one end of each of which is connected to the "H" signal at N8 are still nonconductive, they have no effect on the next-stage node. What has been described up to this point is associated with a first step of the command, in which the write mode is set up.

Next, when external control signals /CE and /WE go from "H" to "L" again, TR9 and TR13 becomes conductive, making the signal at N10 go from "L" to "H", with the result that the output N11 of an inverter circuit using N10 as an gate input goes "L" and the output N12 of an inverter circuit using N11 as an gate input goes "H". However, because the p-channel MOS transistor TR11 and n-channel MOS transistor TR15 are still nonconductive, the change is not transmitted to the next stage.

Then, when external control signals /CE and /WE go from "L" to "H" again, TR11 and TR15 become conductive, which permits a "H" level at N13 to be transmitted to N13, thus causing the signal at N13 to go from "L" to "H", with the result that the output N14 of an inverter circuit using N13 as an gate input goes "L" and the output N15 of an inverter circuit using N14 as an gate input goes "H". This makes the signal at N16 go "L", thus making register circuit output signal PC go "H". This change is transmitted from the command register circuit 7 to the writing system of the control circuit 8, the address latch circuit 2, and the data latch circuit 10.

what has been described up to this point is associated with a second step of the command. The register is constructed so that each time external control signals /CE and /WE go "H", then "L", again "H", the signal is transmitted sequentially inside the command register 7. In parallel with the first and second steps of the command explained in the above command register circuit, the address and writing data are also supplied.

Specifically, when external control signals /CE and /WE are "H" in the second step of the command, external signals $A_0$ to $A_n$ corresponding to a given address are transferred to the address buffer circuit 1. At the same time, the data to be written into a memory cell is set according to external signals $I/O_0$ to $I/O_n$, and is transferred to the input/output buffer circuit 11. At this time, to write data "0" (the state in which the threshold is high) in a memory cell, a "0" ("L") level is set for $I/O_0$ to $I/O_n$. Conversely, to write data "1", a "1" ("H") level is set for $I/O_0$ to $I/O_n$.

Then, the change of external control signals /CE and /WE from "H" to "L" activates the address buffer circuit 1 and the input/output buffer circuit 11, allowing the selected address data and writing data to be transferred to the latch circuits 2 and 10, respectively. According to these sets of data, the latch circuits select the column decoder circuit 3, column gate 5, and row decoder circuit 4. On the basis of the selected column line and row line (control gates), a memory cell in the memory cell array 6 is selected when external control signals /CE and /WE go "H", this starts the command write mode, which permits the control circuit 8 to output a "H" activating signal PRO, thereby activating the write voltage circuit 12. In this state, a write/erase power supply VPP is externally supplied to the chip, and a high voltage SW is applied to the selected column line and row line. With the voltages thus applied, a given data item transferred form the data latch circuit 10 is written into the memory cell.

In this way, the change of external control signals /CE from "H" through "L" to "H" completes a single step of the command. Specifically, in this case, in the first step of the command, the write mode is set up, and in the second step, the address data and the memory cell data are taken in, and then the write mode is started, which allows the data to be written in the selected memory cell.

To erase the data in the memory cell, a similar command control system is used. In this case, too, a specific erase command is previously transferred to the input/output buffer circuit 11 by external signals $I/O_0$ to $I/O_n$. Then, an erase command register (not shown), which has the same arrangement as that of the write command register circuit of FIG. 4, sets up the erase mode in the first step of the command as explained in the write mode. In the second step of the command, the source of the memory cell to be erased from is selected, and the control circuit 8 is activated by the erase command register circuit output signal EC. The control circuit 8 outputs a "H" activating signal ERA, which activates the erase voltage circuit 13. In this state, the external write/erase power supply VPP is supplied to the chip. This enables an erase high voltage VSO to be applied to the source connected to the memory cell array 6, thereby erasing the data in the memory cell.

Similarly, to read the data from the memory cell, the data in the memory cell at the address selected by the column line and the row line corresponding to input signals $A_0$ to $A_n$, which are transferred to these column and row lines via the address buffer circuit 1, address latch circuit 2, column decoder circuit 3, column gate 5, and row decoder circuit 4, is outputted via the sense amplifier circuit 9, the data latch circuit 10, and the input/output buffer circuit 11.

However, when the chip is externally controlled by, for example, the above-described command control system, there is a possibility that a write or an erase command will be taken in erroneously due to power supply noise inside and outside the chip or command-caused noise, which results in a malfunction, eventually leading to the danger of destroying the data in the memory cell. When the memory cell array 6 is divided into blocks, a malfunction can take place in each selected block.

SUMMARY OF THE INVENTION

Accordingly, the object of the present invention is to provide a semiconductor memory device which has the protect function of inhibiting the device from writing and erasing data so that even if an erroneous command is taken in due to power noise or command noise, the command may not stand valid, and which thereby improves the operating margin.

The foregoing object is accomplished by providing an electrically programmable semiconductor memory device comprising: memory cell array means composed of electrically programmable nonvolatile memory cells; memory peripheral circuit means for specifying an address according to an external signal for the memory cell array means and performing an access operation; high-voltage supplying means for data program-related control of the memory cell array means; command register circuit means for supplying a command signal for performing a programmed operation to the memory cell array means according to an external control signal; command signal transfer means for controlling the memory peripheral circuit to perform at least one of a programmed and a reading operation on a given memory cell in the memory cell array means according to the command signal; nonvolatile protect memory means from which data is read whenever a programmed operation is performed on the memory cell array means; sensing means for supplying to the command register circuit means a control signal used when a programmed operation is performed on the protect memory means; protect sense amplifier circuit means for reading data from the protect memory means; protect control circuit means for controlling the protect memory means and the protect sense amplifier circuit means on the basis of the command signal from the command register circuit means; and control circuit means for controlling the high-voltage supplying means to control a programmed operation on the memory cell on the basis of the read-out data from the protect sense amplifier circuit means.

According to the configuration of this invention, a protect memory cell is provided in a semiconductor chip using a command control system. By reading the data from the protect memory cell whenever a command is executed, the device is inhibited from being written into or erased from if an erroneous command is taken in.

Additional objects and advantages of the invention will be set forth in the description which follows, and in part will be obvious from the description, or may be earned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram of part of the circuit of FIG. 3;

FIG. 11 is a circuit diagram of an important portion of FIG. 6;

FIG. 14 is a first circuit diagram of an important portion of FIG. 13; and

DETAILED DESCRIPTION OF THE PREFERRED EMBODIMENTS

Figure 6:
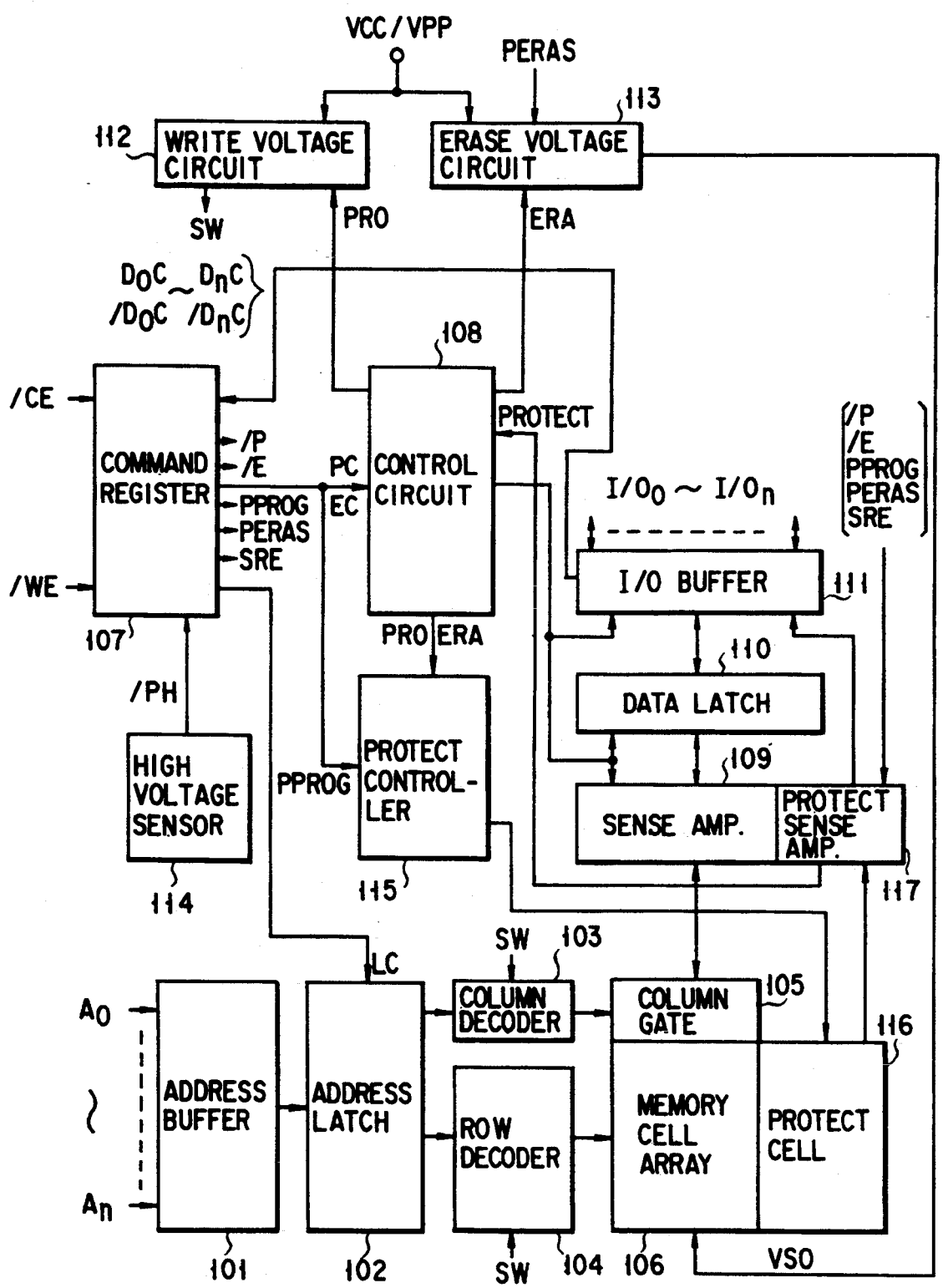
FIG. 6 is a block diagram of a first embodiment of the present invention.

FIG. 6 is a block diagram of a semiconductor memory device according to a first embodiment of the present invention. The chip of this device comprises an address buffer circuit 101, an address latch circuit 102, a column decoder circuit 103, a row decoder circuit 104, a column gate 105, a memory cell array 106, a command register circuit 107, a control circuit 108, a sense amplifier circuit 109, a data latch circuit 110, an input/output buffer circuit 111, a write voltage circuit 112, an erase voltage circuit 113, a high-voltage sensing circuit 114, a write/erase disable control circuit (hereinafter, abbreviated as a protect control circuit) 115, a write/erase disable judging memory cell (hereinafter, abbreviated as a protect cell) 116, and a protect sense amplifier circuit 117. The arrows in the figure indicate the exchange of signals between the individual circuits.

Figure 3:
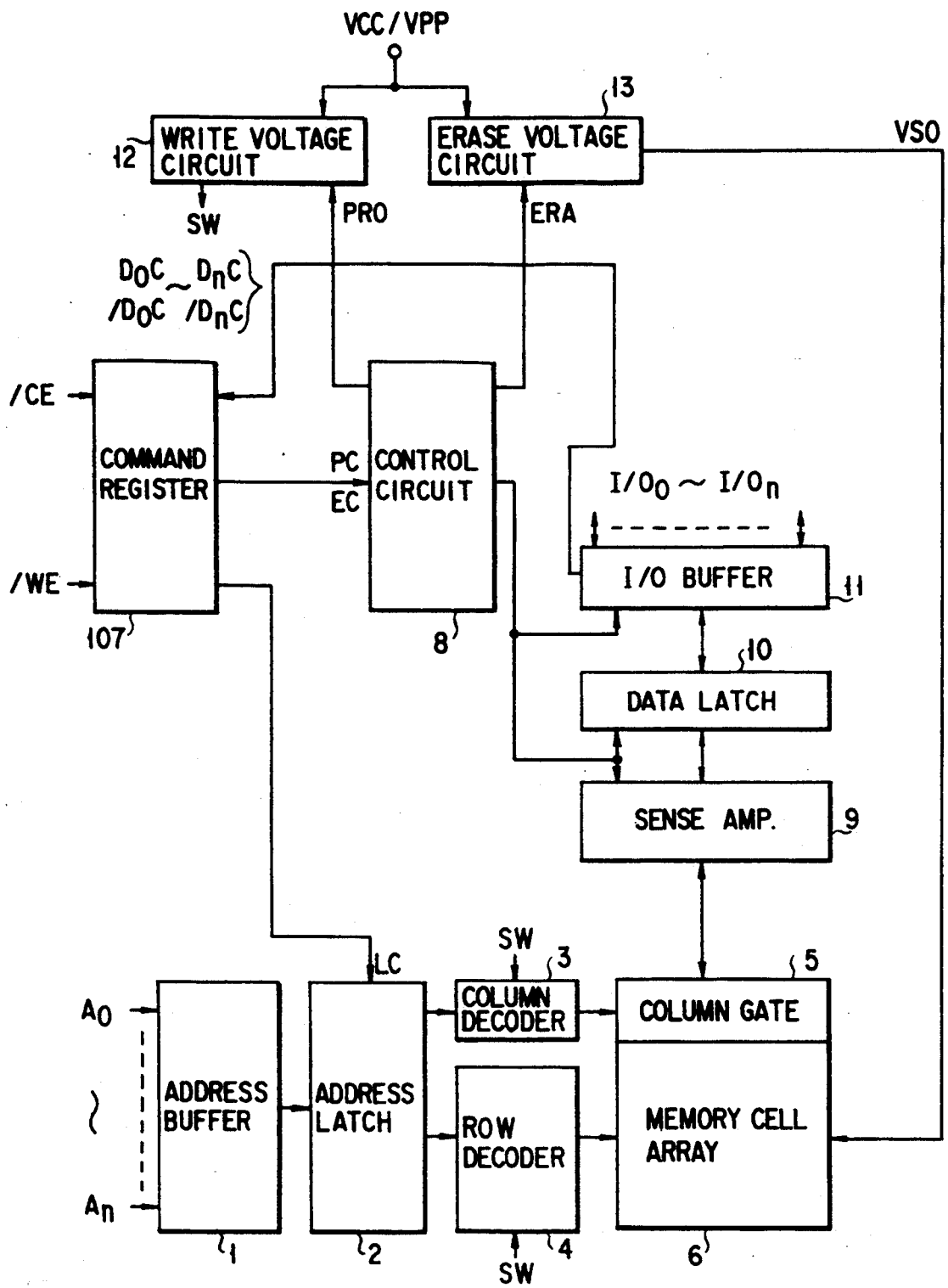
FIG. 3 is a block diagram of a semiconductor memory device using a conventional command control system.
Figure 5:
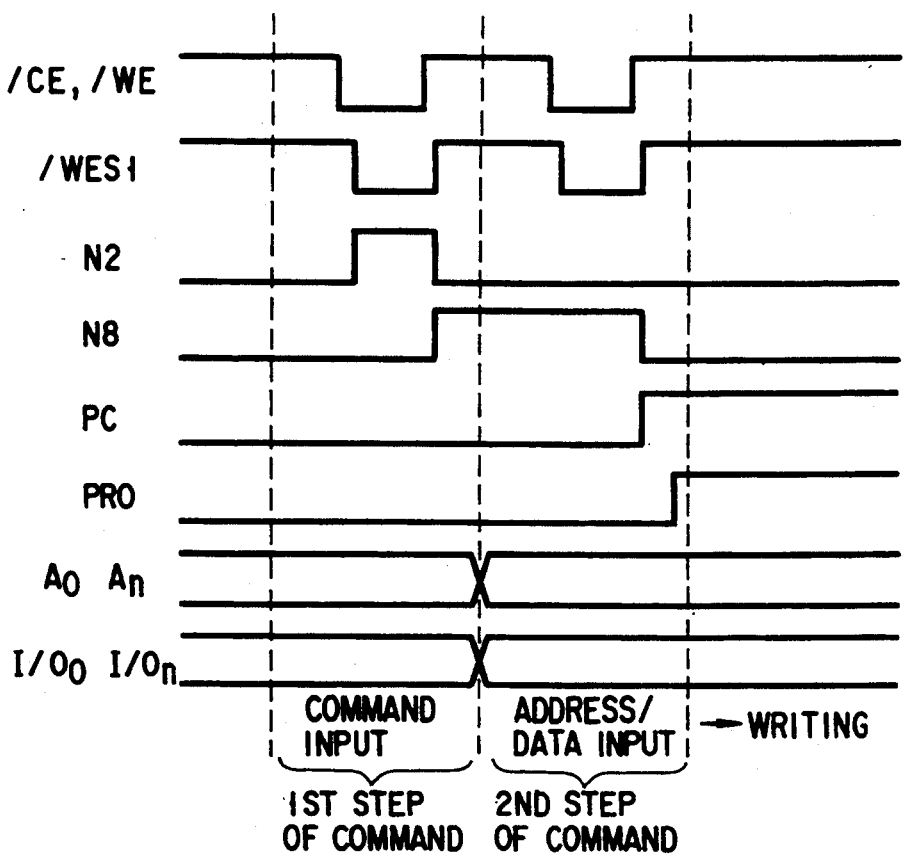
FIG. 5 is a waveform diagram associated with the operation of the circuit of FIG. 4.

As compared with the circuit configuration of FIG. 3, that of FIG. 6 further contains the following four circuits: the high-voltage sensing circuit 114, the protect control circuit 115, the protect cell 116, and the protect sense amplifies circuit 117. The protect cell 116 is composed of a single memory cell transistor provided in the memory cell array 106. The remaining configuration has the same connections as those of FIG. 3.

Figure 7:
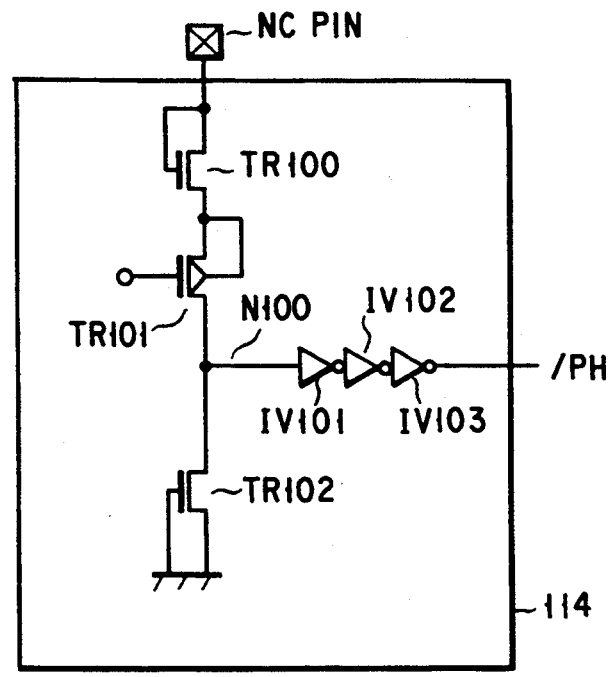
FIG. 7 is a first circuit diagram of part of the circuit of FIG. 6.

FIG. 7 is a circuit diagram of an example of the high-voltage sensing circuit 114 of FIG. 6. The high-voltage sensing circuit 114 is connected to the command register circuit 107 and outputs a signal /PH. The sensing circuit 114 is operated to write or erase the data in the protect cell 116.

In the high-voltage sensing circuit 114, for example, an n-channel enhancement-mode MOS transistor TR100 whose gate and drain are connected to one another, a p-channel MOS transistor TR101 whose gate is connected to a power-supply voltage VCC, and an n-channel depletion-mode MOS transistor TR102 are connected in series with each other with respect to an NC (no connection) pin. The signal /PH is outputted via inverters IV101 to IV103 from output node N100 where the drains of TR101 and TR102 are connected to each other.

In a normal operation, a high-voltage signal is not applied to the NC pin. Thus, output node N100 is always at a "L" level. This signal passes through inverters IV101 to IV103 and goes "H", which makes a "H"

signal /PH. When a high voltage (higher than the power supply voltage VCC) is applied to NC pin, node N100 changes to a "H" level, making output signal /PH low.

Figure 8:
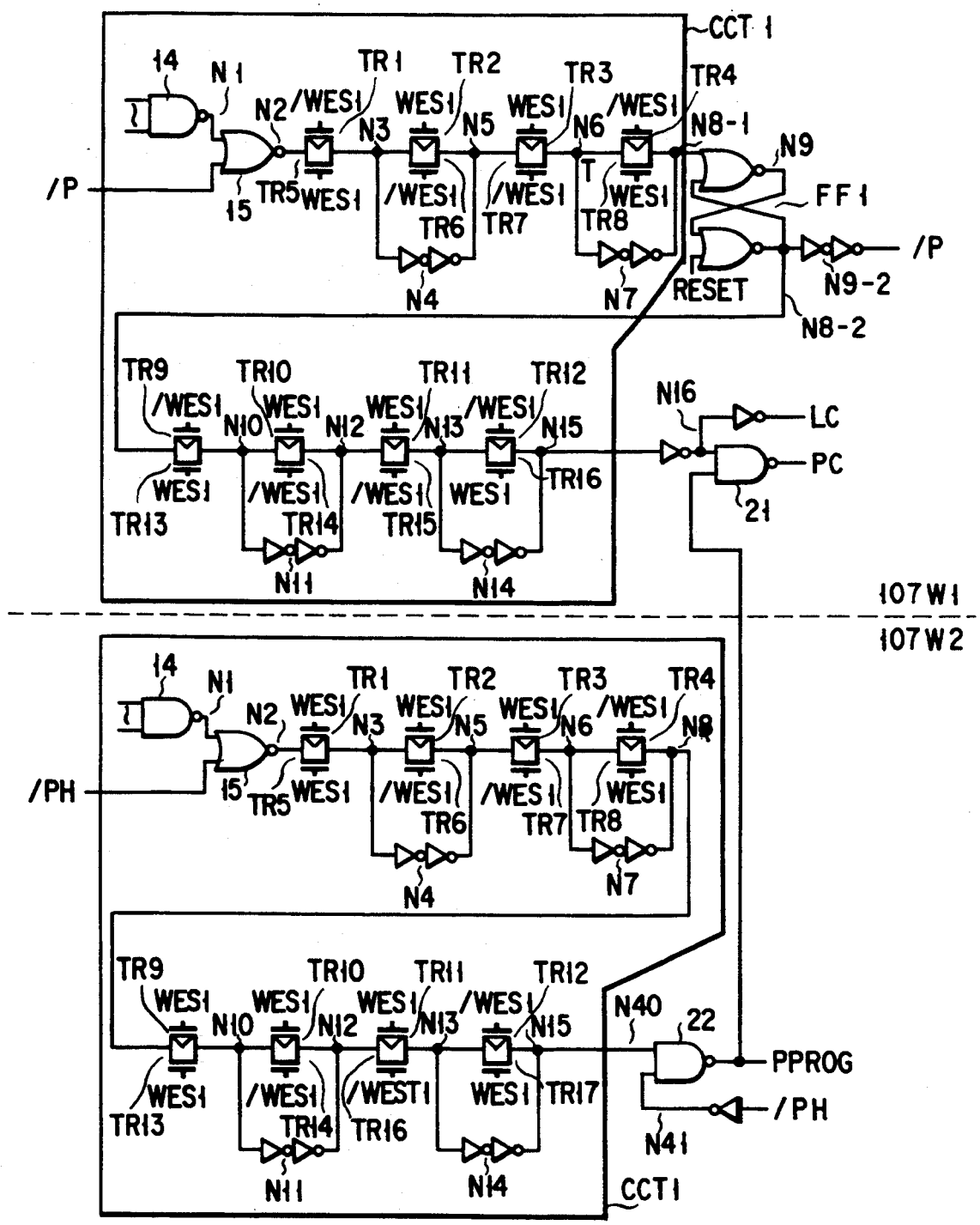
FIG. 8 is a first circuit diagram of part of the command register circuit of FIG. 6.
Figure 9:
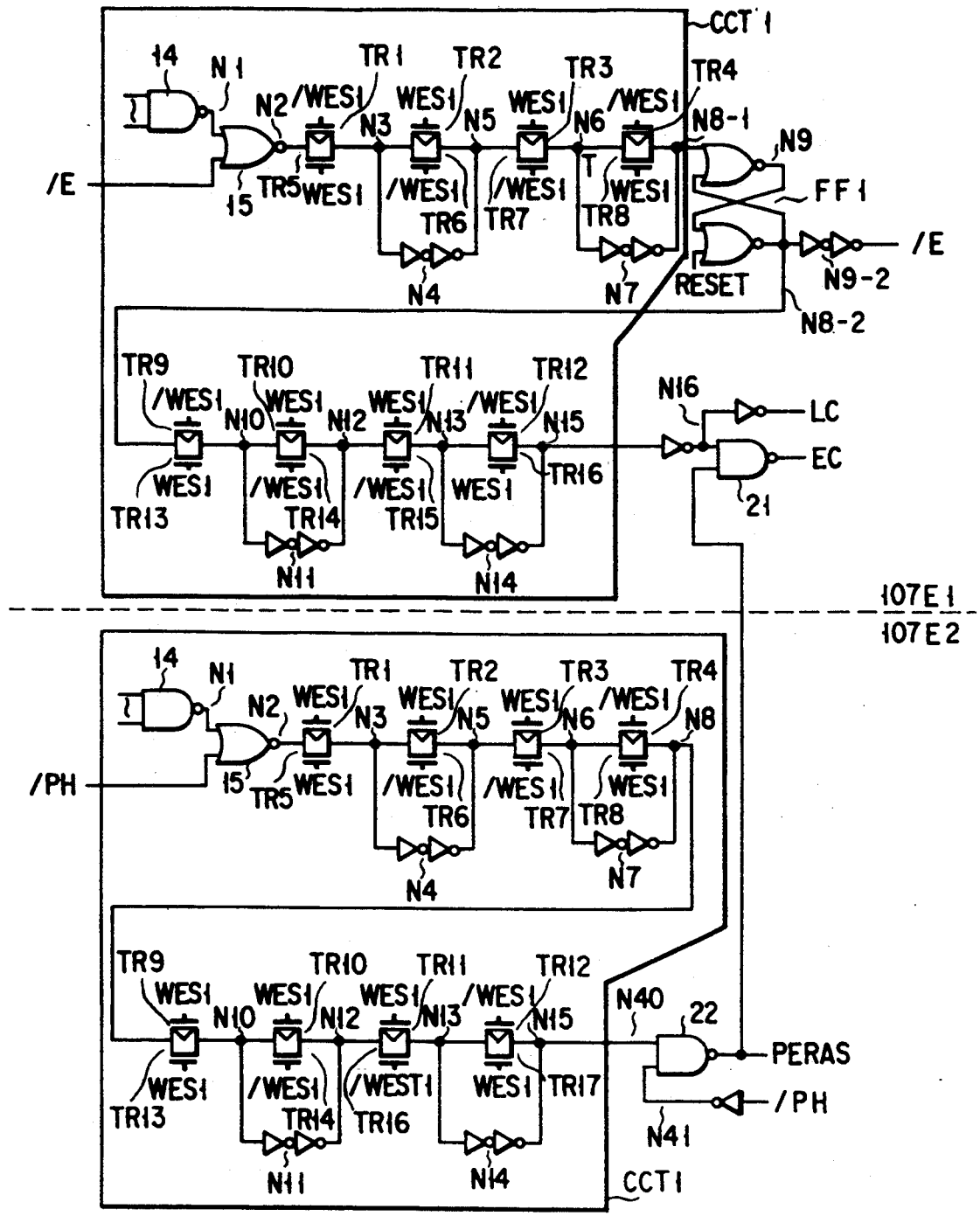
FIG. 9 is a second circuit diagram of part of the command register circuit of FIG. 6.
Figure 10:
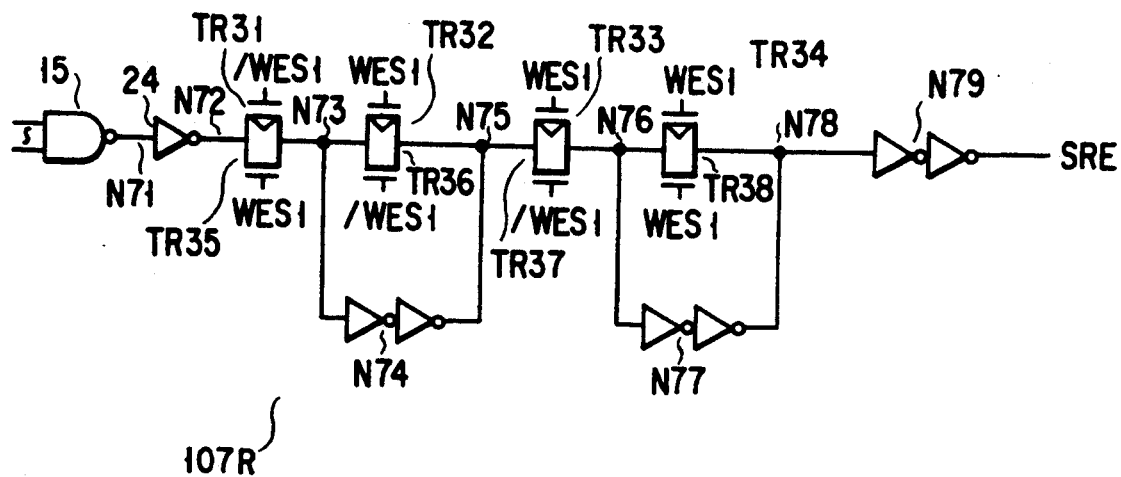
FIG. 10 is a third circuit diagram of part of the command register circuit of FIG. 6.

FIGS. 8 to 10 are circuit diagrams of the command register circuit 107. FIG. 8 shows a write command register circuit 107W1 and a protect write command register circuit 107W2. FIG. 9 shows an erase command register circuit 107E1 and a protect erase command register circuit 107E2. FIG. 10 shows a protect read command register circuit 107R.

The circuit configuration of the write command register circuit 107W1 of FIG. 8 differs from that of FIG. 4 in the following points. First, a flip-flop circuit F.F1 is connected between node N8-1 and node N8-2. A reset signal to be inputted to a NOR circuit 15 is determined to be a signal /P. Second, a NAND circuit 21 using the signal at node N16 and the signal PPROG as two inputs is provided and outputs a signal PC. The output of an inverter circuit whose input is connected to node N16 is determined to be a signal LC.

The protect write command register circuit 107W2 of FIG. 8 has the same circuit CCT1 as that of the above write command register circuit 107W1, but differs from the latter in the following points. First, the signal inputted to the NOR circuit 15 is the signal /PH from the high-voltage sensing circuit 114. Second, a NAND circuit 22 using the signal at node N15 and the inverted signal of the signal /PH as two inputs is provided and outputs a signal PPROG.

The erase command register circuit 107E1 and protect erase command register circuit 107E2 of FIG. 9 have the same circuit arrangement as those of FIG. 8, but differ from the latter in the signal they deal with. Specifically, a signal /E is used instead of signal /P, a signal EC instead of signal PC, and a signal PERAS instead of signal PPROG.

The arrangement of the protect read command register circuit 107R of FIG. 10 differs from that of FIG. 4 in that an inverter circuit 24 is provided in place of the NOR circuit 15, and inverter circuits are connected in series with one another at node N8, or node N78, and outputs a signal SRE.

FIG. 11 shows the circuit arrangement of each of the protect control circuit 115, the protect cell 116, the protect sense amplifier circuit 117, a protect cell write circuit 301, and a protect cell erase circuit 302, and their connections.

The protect control circuit 115 of FIG. 11 is constructed so as to supply a voltage level determined by signals PPROG, PRO, and ERA to the gate of the protect cell 116. A power supply for a depletion-mode transistor connected to an inverter previous to node N27 and to node N26 is switched to a normal power supply of the VCC system during a normal reading operation and to a high voltage of VPP during an erasing operation.

One end of the current path of the protect cell 116 of FIG. 11 is connected to the protect cell erase circuit 302. The other end of the protect cell 116 acts as a bit line BT and is connected to the protect cell write circuit 301 and the protect sense amplifier circuit 117.

The protect sense amplifier circuit 117 of FIG. 11 is activated by the output of a NOR circuit 31 to which the output signal SRE of the protect read command register circuit 107R of FIG. 10, the output signal /P of the write command register circuit 107W1 of FIG. 8, and the output signal /E of the erase command register circuit 107E1 of FIG. 9 are supplied.

The output node N38 of a NOR circuit 32 using the potential at output node N37 of the NOR circuit 31 and that at node N28 on bit line BT as two inputs controls a transistor TR24 supplying a power-supply voltage. The output node N39 of a NOR circuit 33 controls a transfer transistor TR22. The gate and drain of a p-channel MOS transistor TR23 are connected to node N30. The gate of a precharging p-channel MOS transistor TR25 is connected to node N37. The current path of the transistor TR25 is connected between the power supply and the source of the transistor TR23. Two n-channel MOS transistors TR26 and TR27 serve as discharging transistors.

The node N30 is connected to node 32 via two inverter circuits. The node 32 is connected to a NAND circuit and a NOR circuit. The NAND circuit is supplied with the signal at node 32, signal PPROG, and signal PERAS, and outputs a signal PROTECT via an inverter circuit. The NOR circuit is supplied with the signal at node 32 and the inverted signal of signal SRE, and outputs a signal PDS via two inverters.

Figure 12:
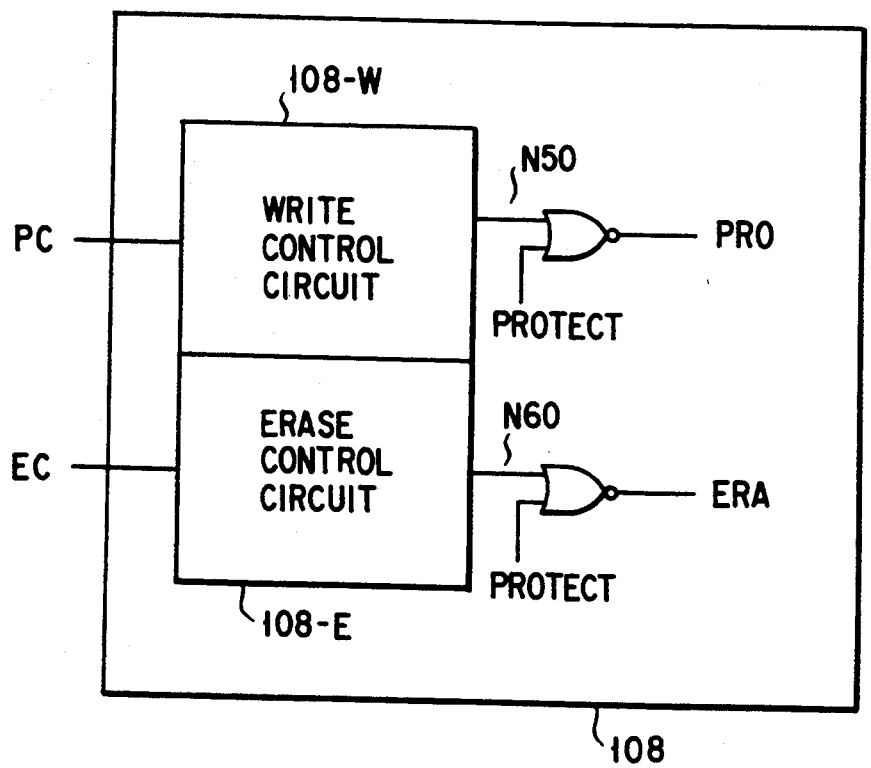
FIG. 12 is a second circuit diagram of part of the circuit of FIG. 6.

FIG. 12 shows the internal structure of the control circuit 108. A write control circuit 108-W is activated by signal PC ("H"), and outputs a specific logic level to node N50. This logic level is supplied together with signal PROTECT to a NOR circuit. The output of the NOR circuit is a signal PRO.

An erase control circuit 108-E is activated by signal EC ("H"), and outputs a specific logic level to node N60. This logic level is supplied together with signal PROTECT to a NOR circuit. The output of the NOR circuit is a signal ERA.

In FIG. 6, when the write/erase disable mode is set (hereinafter, abbreviated as the protect set mode), the data in the protect cell 116 is set in a "0" state. That is, at this time, the threshold value of the protect cell 116 is high. Hereinafter, referring to FIGS. 6 to 12, various operations related to the protect function will be explained.

First, in the protect set mode, the operation of the chip in explaining a specific write command will be described. When the normal command write mode is executed upon arrival of an external control signal, and the chip is activated in the first step of the command, the protect control circuit 115 of FIG. 11 is activated at the same time.

In FIG. 11, in the initial state, the protect write command signal PPROG is "H", the write control signal PRO is "L", and the erase control signal ERA is "L". In the protect control circuit 115, the output node N21 of a NAND circuit using signal PPROG and PRO as gate inputs is at a "H" level, the output node N22 of an inverter circuit using signal ERA as a gate input is at a "H" level, and the output node N23 of NAND circuit using signals at node N21 and N22 as gate inputs is at a "L" level. Further, node N24 via an inverter circuit is at a "H" level, and node N25 via another inverter is at a "L" level.

An n-channel MOS transistor TR20 one end and the other end of which are connected to node N25 and node N26, respectively, is conductive because its gate is applied with the power supply voltage VCC. As a result, node N26 is at a "L" level. A power supply for an inverter circuit IV11 using the signal at node N26 as a gate input is at the normal power supply voltage VCC, except during a protect cell write or erase operation.

The output node N27 of an inverter IV11 goes to a "H" level (the VCC system), which is applied to the control gate of the protect cell 116. However, because the protect cell 116 is in a write state of the high threshold value, keeping the memory cell nonconductive.

In the protect sense amplifier circuit 117, the output node N37 of NOR circuit 31 changes from a "H" to a "L" level because of the output signal /P of the write command resister circuit 107W1, therefore, the protect sense amplifier circuit 117 is activated, the bit line is precharged at the potential of node N30 generated by transistors TR25 and TR23, keeping the protect cell 116 nonconductive. As a result, a "0" (a high potential) is transferred as data to the protect sense amplifier circuit 117. Therefore, a "H" level at node N30 is supplied to the next-stage inverter circuit, thereby placing node N31 at a "L" level and node N32 at a "H" level.

The aforementioned protect write command signal PPROG is "H" and the protect erase command signal PERAS is also "H" in the initial state. The output node N33 of a NAND circuit using signal PERAS, signal PPROG, and the signal at node N32 as gate inputs is at a "L" level, and the output signal PROTECT through an inverter is "H".

Next, at the end of the second step of the command, the output signal PC of the write command register circuit 107W1 of FIG. 8 is "H". Because the signal PC is connected to the write control circuit 108-W of the control circuit 108 of FIG. 12, the write control circuit 108-W is activated. This makes node N50 change from a "H" to a "L" level. However, a NOR circuit using the signal at node N50 and signal PROTECT ("H") as gate inputs maintains the output signal PRO at a low level. Consequently, the write voltage circuit 112 to which signal PRO has been transferred is not activated, and the external power supply VPP is not supplied to the chip either. As a result, the write high voltage SW is not supplied to the chip either, thereby preventing the selected memory cell from being written into.

Now, the case where the erase mode is executed in the protect set mode will be explained. In the first step of the command, the protect sense amplifier circuit 117 supplies a "H" output signal PROTECT on the basis of the data in the protect cell 116 and the output signal /E of the erase command circuit 107E1, as in the write mode in the protect set mode.

In the second step of the command, the output signal EC of the erase command register circuit 107E1 of FIG. 9 goes to a "H" level, which is transferred to the control circuit 108 of FIG. 12. This activates the erase control circuit 108-E, causing node N60 to change from a "H" to a "L" level. However, a NOR circuit using the signal at node N60 and signal PROTECT ("H") as gate inputs maintains its output signal ERA at a "L" level. As a result, the erase voltage circuit 113 is not activated by signal ERA, and thus the external power supply VPP is not supplied to the chip either. Consequently, the erase high voltage VSO is not supplied either, thereby preventing the data in the memory cell connected to the selected source from being erased.

As described above, even if the command write mode or the command erase mode is controlled from outside the chip, the protect sense amplifier circuit 117 produces a write/erase disable signal PROTECT, provided after the protect sense amplifier has read the data from the protect cell 116, it is found that the data in the protect cell 116 is a "0", or in the protect set mode. Because the signal PROTECT prevents the control circuit 108 from outputting signal PRO or signal ERA, neither writing nor erasing can be effected.

Furthermore, because the write voltage circuit 112 or erase voltage circuit 113 in which a step-up circuit for producing a high voltage required for a write or erase operation is incorporated operates after the execution of writing or erasing has been determined completely, the voltage is not raised in the protect set mode, thereby preventing the power from being wasted.

Explained next will be the circuit operation in the case where the non-write/erase disable mode, or in the normal write mode is set (hereinafter, abbreviated as the protect reset mode). In this case, the data in the protect cell 116 is in an erase state with a low threshold of "1". As a result, in the first step of the command, the output signal PROTECT of the protect sense amplifier circuit 117 is low, the reverse of what is in the protect set mode.

When a write command is entered, the output signal PC of the write command register circuit of FIG. 8 goes "H", and the output signal PRO of the write control circuit 108-W in the control circuit 108 of FIG. 12 changes from "L" to "H". Consequently, the write voltage circuit 112 is activated and operates in the normal mode, in other words, a predetermined data corresponds to the address which is sat in the second step of the command, being written into the memory cell array 106.

Additionally, in the protect control circuit 115 of FIG. 11, the output node N21 of the NAND circuit using signal PPROG and signal PRO as gate inputs changes from a "H" to a "L" level, which causes the output node N23 of the next-stage NAND circuit to go to a "H" level, making the gate of the protect cell to which node N27 is connected via an inverter go to a "L" level. As a result, since the protect cell write circuit 301 is not activated by signal PPROG, data will not be written in the protect cell by erroneously applying a high voltage to this cell.

Similarly, when the normal erase mode is sat up, the output signal EC of the erase command register circuit of FIG. 9 goes "H", causing the output signal ERA of the erase control circuit 108-E of FIG. 12 to change from "L" to "H". As a result, the erase voltage circuit 113 is activated and operates in the normal erase mode. Additionally, in the protect control circuit 115 of FIG. 11, the output node N22 of the inverter circuit using signal ERA as a gate input changes from a "H" to a "L" level, causing the output node N23 of the next-stage NAND circuit to go to a "H" level. As a result, the gate of the protect cell 116 at node N27 via an inverter goes to a "L" level. As a result, since protect cell erase circuit 302 is not activated by signal PERAS, data will not be erased in the protect cell erroneously.

Next, the aforementioned protect set mode, or protect cell writing means will be explained. The protect set mode can also be set by the command control system. First, when a high voltage (e.g., 12 V) is externally applied to the NC pin, the output signal /PH of the high-voltage sensing circuit 114 changes from "H" to "L".

In the first step of the command started by external control signals /CE and /WE, specific command signals in the protect set mode (all the high signals of $D_0C$ to $D_nC$ and $/D_0C$ to $/D_nC$) are transferred from external signals $I/O_0$ to $I/O_n$ via the input/output buffer circuit 111 to the command register circuit 107. At the same time, the command register circuit 107 receives a "L" signal /PH.

As a result, the protect write command register circuit of FIG. 8 is activated. At this time, the node N40 of the protect write command register circuit outputs a "L" level of the initial state. The output node N41 of an inverter using signal /PH as a gate input goes to a "H" level, the output signal PPROG of a NAND circuit using the signals at nodes N40 and N41 as gate inputs goes "H", and the output signal PC of a NAND circuit in the output stage of the write command register circuit supplied with signal PPROG goes "L" and signal PRO is kept at a "L" level.

At this time, in the protect control circuit 115 of FIG. 11, signal PRO and signal ERA are both "L". Because signal PPROG is "H", the output N21 of the NAND circuit is high. Therefore, node N22 is at a "H" level, which makes the output N23 of the NAND circuit "L". Then, node N27 via an inverter circuit goes to a "H" level. With node N27 at a "H" level, the protect cell is selected. However, since the protect sense amplifier 117 is not activated yet, node N30 is a "L" level, thus node N31 is a "H" level and node N32 is a "L" level. As a result, the output signal PROTECT of the protect sense amplifier circuit 117 is "L".

Unlike the normal command write mode, in the second step of the command, signal LC is supplied separately to the address latch circuit 102 and the data latch circuit 110 so that the write command register circuit may not activate these circuits. Specifically, each latch circuit is controlled so that the memory cells in the memory cell array 106 may not be selected unless only the normal write command is inputted and the command register is activated.

In the second step of the command, the node N40 of the protect write command register circuit 107W2 of FIG. 8 goes to a "H" level, which causes the output signal PPROG of the NAND circuit using the signals at nodes N40 and N41 as gate inputs to change from "H" to "L", making the output signal PC of the output-stage NAND circuit of the write command register circuit connected to signal PPROG change from "L" to "H".

In response to the change of signal PC, the output node N50 of the write control circuit 108-W of FIG. 12 goes to a "L" level, causing signal PRO to change from "L" to "H". This signal PRO activates the write voltage circuit 112, which allows the external power supply VPP to be supplied to the chip, enabling the high voltage SW to be supplied to the internal circuit.

Furthermore, the output N21 of the NAND circuit connected to signals PPROG and PRO in the protect control circuit 115 of FIG. 11 is kept at a "H" level, which places node N23 a "L" level, node N24 a "H" level, nodes N25 and N26 at a "L" level, and the output node N27 of the next-stage inverter circuit at a "H" level. At this time, because the high voltage SW is supplied to one end of a p-channel MOS transistor constituting an inverter circuit, a high voltage is applied to node N27. At the same time, a high voltage generated by the protect cell write circuit 301 to which the external power supply VPP and signal PPROG are inputted is supplied to node N28, which causes data "0" to be written in the protect cell 116.

Next, means of erasing the data from or resetting the protect cell will be described. The protect resetting mode can also be set by the command control system. First, at the same time when data is written in the protect cell, a high voltage (e.g., 12 V) is externally applied to NC pin to make signal /PH "L".

In the first step of the command started by external control signals /CE and /WE, specific command signals in the protect reset mode (the "H" signals of $D_0C$ to $D_nC$ and /$D_0C$ to /$D_nC$) are transferred from external signals I/O$_0$ to I/O$_n$ via the input/output buffer circuit 111 to the command register circuit 107. At the same time, the command register 107 receives a "L" signal /PH from the high-voltage sensing circuit 114 (FIG. 6). As a result, the protect erase command register circuit 107E2 of FIG. 9 is activated. The output signal PERAS becomes "H", and the output signal EC of the erase command register circuit to which signal PERAS is supplied becomes "L".

Signal PPROG is "H" in the initial state, signal PRO and signal ERA are both "L", which causes the output node N21 of the NAND circuit supplied with signal PPROG in the protect control circuit 115 of FIG. 11 to go to a "H" level, placing the next-stage node N23 at a "L" level and node N27 via an inverter a "H" level. As a result, the protect cell is placed in the selected state. However, because the protect sense amplifier is not activated, node N30 is at a "L" level and the output signal PROTECT is "L".

In the second step of the command, the output signal PERAS of the protect erase command register circuit of FIG. 9 changes from "H" to "L", which makes the output signal EC of the erase command register circuit change from "L" to "H". In response to the change of signal EC, the output node N60 of the erase control circuit 108-E of FIG. 12 goes to a low level, thereby causing signal ERA to change from low to high. Because the signal PERAS controls it does not activate the erase voltage circuit 113, the external power supply VPP is not supplied to the chip, and consequently the high voltage VSO is not supplied to the internal circuit either.

Furthermore, as shown in FIG. 8, at this time, the output node N22 of the inverter circuit using signal ERA as a gate signal in the protect control circuit 115 goes to a "L" level, which makes the output node N23 of the NAND circuit using the signals at nodes N22 and N21 as gate inputs go to a "H" level, output node N24 go to a "L" level, nodes N25 and N26 go to a "H" level, and the output node N27 of the next-stage inverter circuit go to a "L" level. As a result, the control gate of the protect cell 116 is in an unselected state. At the same time, a high voltage generated by the external power supply VPP supplied to the protect erase circuit 302 activated by signal PERAS is applied to the source of the protect cell 116, thereby erasing the data in the protect cell 116.

Next, means for judging whether or not data can be written into or erased from the memory cell array 106 by reading the data from the protect cell 116 by external control to judge whether the chip is in the protect set mode or in the protect reset mode, will be explained with reference to the configuration of the protect cell read command register circuit of FIG. 10.

The first step of the command begins with external control signals /CE and /WE changing from "H" to "L" and the chip being activated. Specific command signal to read the protect cell (all of the "H" signals of $D_0C$ to $D_nC$ and /$D_0C$ to /$D_nC$) are supplied from external signals I/O$_0$ to I/O$_n$ via the input/output buffer circuit 111 to the NAND circuit 15. Its output node N71 goes to a "L" level, and the output node N72 of the next-stage inverter circuit goes to a "H" level. Because a p-channel MOS transistor TR31 and an n-channel MOS transistor TR35 are conductive, making node N73 go to a "H" level, node N74 via an inverter circuit go to a "L" level, and node N75 go to a "H" level.

At this time, signal PPROG is "H", signal PRO is "L", and signal ERA is "L". In the protect control circuit 115 of FIG. 11 to which these signals are supplied, the output node N21 of the NAND circuit goes to a "H" level, the output node N22 of the inverter goes to a "H" level, node N23 goes to a "L" level, and node N27 via an inverter circuit goes to a "H" level. As a result, the protect cell is in the selected state. At this time, when the data in the protect cell 116 is in the write mode, or in the protect set mode, a "H" signal is supplied to node N32. Conversely, when it is in the erase mode, or the protect reset mode, a "L" signal is supplied to node N32.

Then, when the external control signal changes from "L" to "H", a p-channel MOS transistor TR33 and an n-channel MOS transistor TR37 in FIG. 10 change from a nonconductive to a conductive state. As a result, a "H" level at node N75 causes node 76 to go to a "H" level, making node N77 go to a "L" level, node N78 go to a "H" level, and node N79 go to a "L" level through the respective inverters. Consequently, the output signal SRE of the protect cell read command register circuit goes "H".

The signal SRE makes the node N34 of the protect sense amplifier circuit 117 go to a "L" level. The output node N35 of the NOR circuit using the signals at nodes N32 and N34 as gate inputs goes to a "L" level if node N32 is at a "H" level. Then, node N36 goes to a "H" level, and signal PDS goes "L". In this state, when the data in the selected protect cell is in the write mode, a "0" is outputted via the input/output buffer circuit 111 connected to the selected cell, making it possible to check the protect set mode from the outside.

Conversely, if node N32 is at a "L" level, node N35 goes to a "H" level. Then, node N36 goes to a "L" level, and signal PDS goes "H". In this state, when the data in the selected protect cell is in the erase mode, a "1" is outputted via the input/output buffer circuit 111 connected to the selected cell, making it possible to check the protect reset mode from the outside.

As described above, by providing a write/erase disable function in the chip in order to protect the data in the memory cells, the destruction of the data in the memory cells can be prevented in the protect set mode in which writing and erasing are disabled, even if an erroneous command is taken in due to power noise or command noise during command input, causing a malfunction. This increases the operating margin, improving the reliability. By using a nonvolatile memory cell for the protect cell (a write/erase disable cell), the protect set mode and the protect reset mode can be easily controlled in writing and erasing the data in and form the memory cell. In addition, as described earlier, it is possible to eliminate a waste of power due to raising a voltage.

Figure 13:
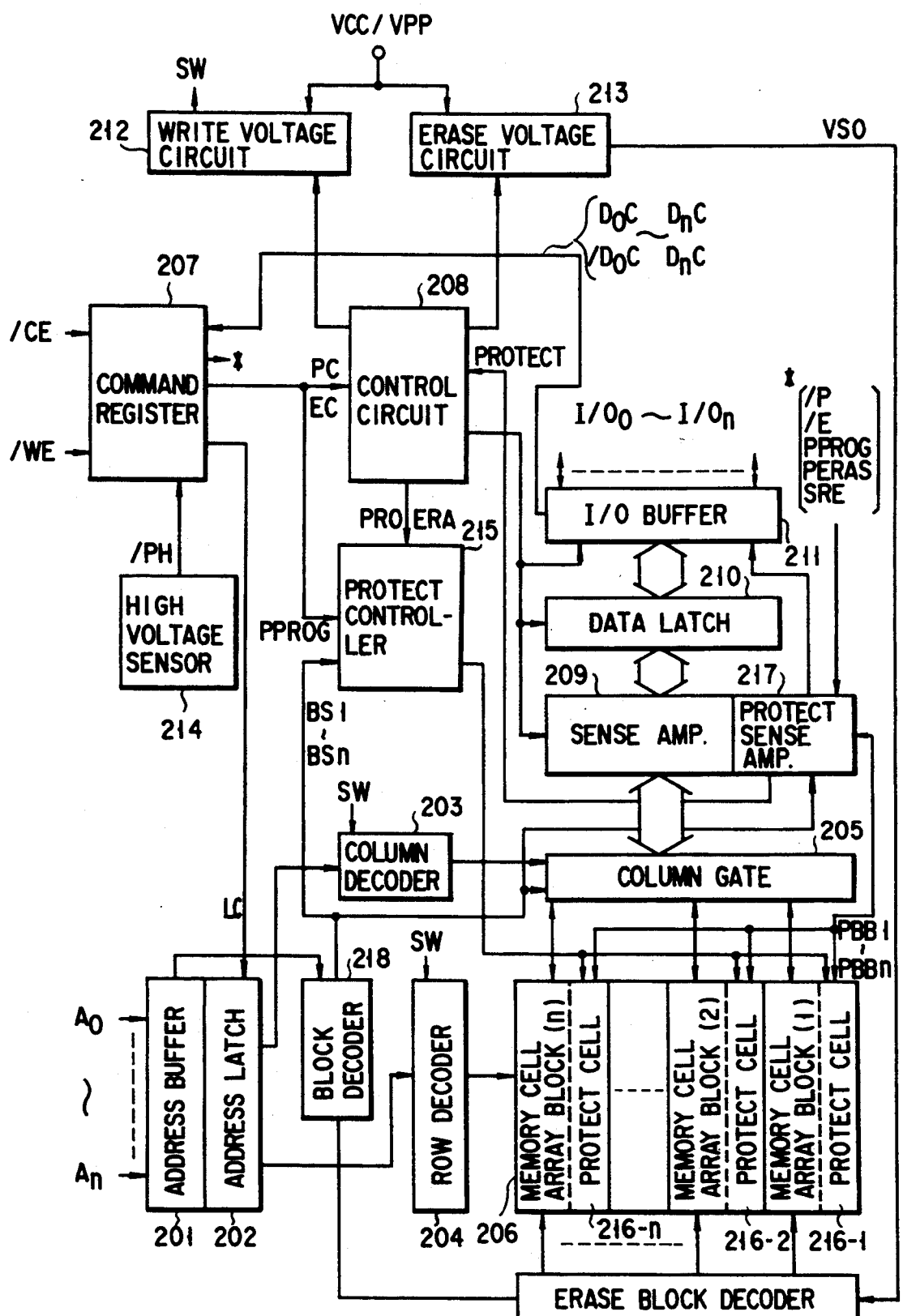
FIG. 13 is a circuit block diagram of a second embodiment of the present invention.

FIG. 13 is a circuit block diagram of a semiconductor memory device according to a second embodiment of the present invention. The chip of this device comprises an address buffer circuit 201, an address latch circuit 202, a column decoder circuit 203, a row decoder circuit 204, a column gate 205, a memory cell array block 206 (206-1 to 206-n), a command register circuit 207, a control circuit 208, a sense amplifier circuit 209, a data latch circuit 210, an input/output buffer circuit 211, a write voltage circuit 212, an erase voltage circuit 213, a high-voltage sensing circuit 214, a write/erase disable control circuit (hereinafter, referred to as a protect control circuit) 215, a write/erase disable judging memory cell (hereinafter, referred to as a protect cell) 216 (216-1 to 216-n), a protect sense amplifier circuit 217, a block decoder circuit 218, and an erase block decoder circuit 219. The arrows in the figure indicate the exchange of signals between the individual circuits.

As compared with the circuit configuration of FIG. 3, that of FIG. 13 further contains the following six circuits: the high-voltage sensing circuit 214, the protect control circuit 215, the protect cell 216 (216-1 to 216-n), the protect sense amplifier circuit 217, the block decoder circuit 218, and the erase block decoder 219. The protect cell 216 is composed of a single memory cell transistor provided in each memory cell array block 206. The remaining configuration has the same connections as those of FIG. 3.

Figure 1:
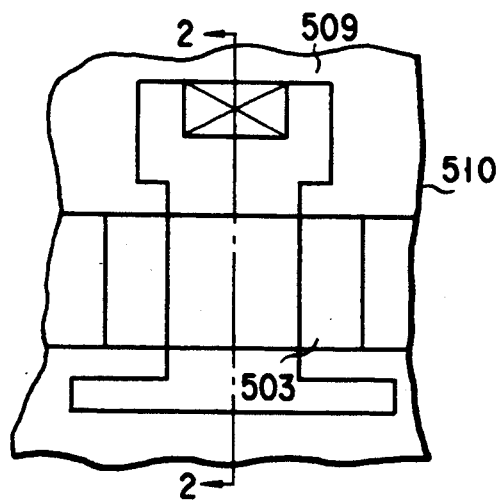
FIG. 1 is a plan view of a memory cell portion of a floating-gate MOS transistor.
Figure 2:
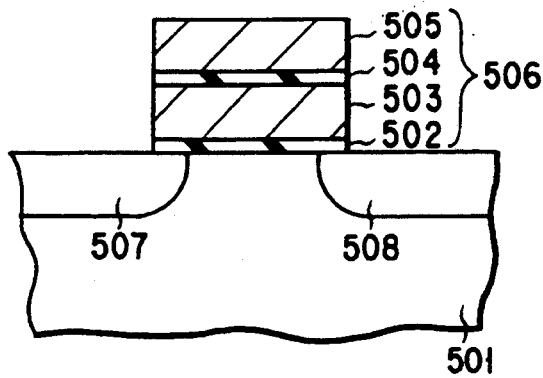
FIG. 2 is a sectional view taken along line 2—2 of FIG. 1.

The high-voltage sensing circuit 214 of FIG. 13 has the arrangement of FIG. 2, for example. The command circuit 207 has the same configuration of FIGS. 8 to 10, for example. The control circuit 208 has the same arrangement of FIG. 12, for example.

Figure 15:
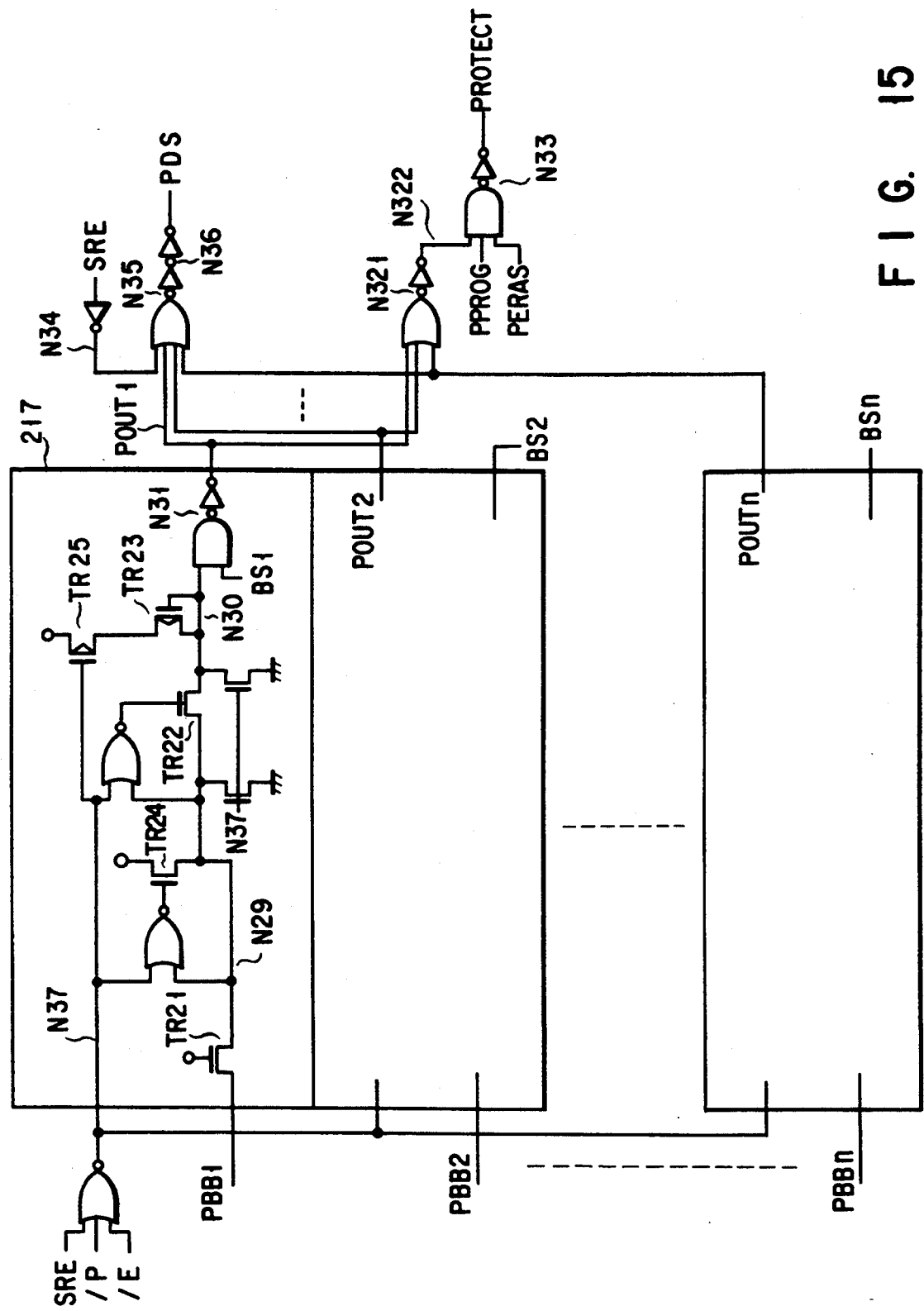
FIG. 15 is a second circuit diagram of an important portion of FIG. 13.

FIG. 14 shows the circuit arrangements of the protect control circuit 215, the protect cells 216-1 to 216-n, the protect sense amplifier circuit 217, protect-cell write circuits 301, 303, and 305, and protect-cell erase circuits 302, 304, and 306, and their connections. In the figure, the protect control circuit 215 has the same circuit arrangement as that of the protect control circuit 115 of FIG. 11. FIG. 15 shows the circuit configuration of the protect sense amplifier circuit 217 and its connections.

Hereinafter, referring to FIGS. 13 to 15, FIGS. 7 to 10, and FIG. 12, the operation related to a protect action will be described. In FIG. 13, when the memory cell array block 206-1 of the memory cell blocks 206 is set in the write/erase disable mode (the protect set mode), the data in protect cell 216-1 corresponding to the memory cell array block 206-1 is set in a "0" state. That is, the threshold of protect cell 216-1 is high.

The operation of the chip in executing a specific write command in the protect set mode under the above conditions will be explained. First, in the presence of an external control signal, the normal command write mode is executed and then the address corresponding to the memory cell array block 206-1 is selected, and the chip is activated in the first step of the command, which then activates the protect control circuit. In FIG. 14, in the initial state, the protect write command signal PPROG is "H", the write control signal PRO is "L", and the erase control signal ERA is "L". Because an n-channel MOS transistor Tr20 has its gate connected to a power supply voltage VCC, it is conductive. As a result, the output N27 of an inverter using the signal at node N26 as a gate input goes to a "H" level. However, because the protect cell 206-1 is in the write state with a high threshold, the memory cell is nonconductive.

Data "0" in the protect cell is connected via connection line PBB1 to the protect block sense amplifier circuit 217-1 of the protect sense amplifier circuit 217. At this time, the individual data items in the other protect cells 216-2 to 216-n connected to node N27 are 1s, which are transferred via PBB2 to PBBn to protect block sense amplifier circuits 217-2 to 217-n, respectively.

The protect sense amplifier circuit 217 of FIG. 15 is divided into blocks, each of which has the same configuration as that of the protect sense amplifier 117 of FIG. 11. For example, data "0" in the protect cell 216-1 is taken from connection line PBB1 into the protect sense amplifier circuit 217-1 in the protect sense amplifier circuit 217. Signal "0" on connection line PBB1 is given to node N29 via an n-channel MOS transistor Tr21 that transfers the signal. Because the output signal /P of the write command resister circuit, the protect sense amplifier circuit 217-1 is activated. A high voltage at N30 generated by a load transistor Tr23 is supplied to one node of the next-stage NAND circuit. Because output signal BS1 of the block decoder circuit supplied to the other node of the NAND circuit is also "H", node N31 is at a "L" level and the output POUT1 is at a "H" level. At this time, the outputs POUT2 to POUTn of the protect block sense amplifier circuits 217-2 to 217-n connected to PBB2 to PBBn are at a "L" level. As a result, the output N321 of a NOR circuit using POUT1 to POUTn as gate inputs is at a "L" level and N322 is at a "H" level.

The aforementioned protect write command signal PPROG and the protect erase command signal PERAS are both "H" in the initial state. Therefore, the output node N33 of a NAND circuit using signal PERAS, signal PPROG, and the signal at node N322 as gate inputs is at a "L" level, and the output signal PROTECT via an inverter is "H".

Next, at the same time when the second step of the command has finished, the output signal PC of the write command register circuit 107W1 of FIG. 8 goes "H". Because the signal PC is further connected to the write control circuit 108-W of the control circuit 108 of FIG. 12, the write control circuit 108-W is activated. This makes node N50 change from a "H" to a "L" level. However, a NOR circuit using the signal at node N50 and signal PROTECT ("H") as gate inputs maintains the output signal PRO at a "L" level. Consequently, the write voltage circuit 212 to which signal PRO has been transferred is not activated, and the external power supply VPP is not supplied to the chip either. As a result, the write high voltage SW is not supplied to the internal circuit either, thereby preventing the selected memory cell from being written in.

Next, the case where the erase mode is executed in the protect set mode will be explained. In the first step of the command, the protect sense amplifier circuit 217 is activated and supplies a "H" output signal PROTECT on the basis of the data in the protect cell 216-1 and the output signal /E of the erase command circuit, as in the write mode in the protect set mode mentioned above.

In the second step of the command, the output signal EC of the erase command register circuit 107E1 of FIG. 9 goes to a "H" level, which is transferred to the control circuit 208. This activates the erase control circuit 108-E, causing node N60 to change from a "H" to a "L" level. However, a NOR circuit using the signal at node N60 and signal PROTECT ("H") as gate inputs maintains its output signal ERA at a "L" level. As a result, the erase voltage circuit 213 is not activated by signal ERA, and the external power supply VPP is not supplied to the chip. Consequently, the erase high voltage VSO is not supplied either, thereby preventing the data in the memory cell connected to the selected source from being erased.

As described above, even if the command write mode or the command erase mode is controlled from outside the chip, the protect sense amplifier circuit produces a write/erase disable signal PROTECT, provided the data in the protect cell is data "0", or in the protect set mode. Because the signal PROTECT prevents the control circuit 208 from outputting signal PRO or signal ERA, neither writing nor erasing is effected.

Furthermore, because the write voltage circuit 212 or erase voltage circuit 213 in which a step-up circuit for producing a high voltage required for a write or erase operation is incorporated operates after the execution of writing or erasing has been determined completely, the voltage is not raised in the protect set mode, thereby preventing the power from being wasted.

Explained next will be the circuit operation in the case where the protect cell 216-2 in the memory cell array block 206 is selected by use of external signal $A_0$, to $A_n$ and the normal write mode, or the protect set mode, is set. In this case, the data in the protect cell is in an erase state with a low threshold value of "1". As a result, in the first step of the command, however output signal BS2 of block decoder circuit is "H" level, because bit line PBB2 is "1", output signal POUT2 is "L". At this time, output signal POUT1 (write mode state) is "L" level because of output signal BS1 is "L" (no selected). The output signal PROTECT of the protect sense amplifier circuit 217 is "L", the reverse of what is in the protect set mode.

When a write command is entered, the output signal PC of the write command register circuit of FIG. 8 goes "H" in the second step of the command, and the output signal PRO of the write control circuit 108-W in the control circuit 108 of FIG. 12 changes from "L" to "H". Consequently, the write voltage circuit 212 is activated and operates in the normal mode, enabling data to be written into the memory cell array block 206-2.

Additionally, in the protect control circuit 215 of FIG. 14, the output node N21 of a NAND circuit using signal PPROG and signal PRO as gate inputs changes from a "H" to a "L" level, which causes the output node N23 of the next-stage NAND circuit to go to a "H" level, making the gate of the protect cell to which node N27 is connected via an inverter go to a "L" level, and protect-cell write circuits is not activated because of the signal PPROG. As a result, data will not be written in the protect cells 206-1 to 206-n by erroneously applying a high voltage to these cells.

Similarly, the output signal EC of the erase command register circuit of FIG. 9 goes "H", causing the output signal ERA of the erase control circuit 108-E of FIG. 12 to change from "L" to "H". As a result, the erase voltage circuit 212 is activated and operates in the normal mode. Further, the data is erased from memory cell array block 206-2 selected by the erase block decoder circuit 219 of FIG. 13.

Additionally, in the protect control circuit 215 of FIG. 14, the output node N22 of an inverter circuit using signal ERA as a gate input changes from a "H" to a "L" level, causing the output node N23 of the next-stage NAND circuit to go to a "H" level. As a result, the gate of each protect cell connected to node N27 via an inverter goes to a "L" level.

Next, the aforementioned protect set mode, or a protect cell writing means will be explained. The protect set mode can also be set by the command control system. First, when a high voltage (e.g., 12 V) is externally applied to the NC pin, the output signal /PH of the high-voltage sensing circuit 214 (114) changes from "H" to "L". At this time, the address corresponding to the predetermined protect cell (206-1 to 206-n) is sat by use of external signal $A_0$ to $A_n$.

In the first step of the command started by external control signals /CE and /WE, specific command signals in the protect set mode (all of the "H" signals of $D_0C$ to $D_nC$ and $/D_0C$ to $/D_nC$) are transferred from external signals $I/O_0$ to $I/O_n$ via the input/output buffer circuit 211 to the command register circuit 207. At the same time, the command register circuit 207 receives a "L" signal /PH.

As a result, the protect write command register circuit of FIG. 8 is activated. At this time, the node N40 of the protect write command register circuit outputs a "L" level of the initial state. The output node N41 of an inverter circuit using signal /PH as a gate input goes to a "H" level, the output signal PPROG of a NAND circuit using the signals at nodes N40 and N41 as gate inputs goes "H", and the output signal PC of a NAND circuit in the output stage of the write command register circuit supplied with signal PPROG goes "L".

Further, the output N21 of the NAND circuit in the protect control circuit 215 supplied with signal PPROG as with the write command register circuit goes "H", as shown in FIG. 14. At this time, because signal ERA is "L" and thus node N22 is at a "H" level, which makes the output N23 of the NAND circuit "L", consequently making node N27 go to a "H" level, therefore, protect cells 206-1 to 206-n is selected. However, since the protect sense amplifier circuit 217 is not activated, the output signal POUT1 to Poutn is "L" level. As a result, the output signal PROTECT of the protect sense amplifier circuit 217 is "L".

Unlike the normal command write mode, in the second step of the command, signal LC is supplied separately to the address latch circuit 202 and the data latch circuit 210 so that the write command register circuit may not activate these circuits. Specifically, each latch circuit is controlled so that the memory cells in the memory cell array blocks other than the selected one in the memory cell array 206 may not be selected unless only the normal write command is inputted and the register circuit is activated.

In the second step of the command, the node N40 of the protect write command register circuit 107W2 of FIG. 8 goes to a "H" level, which causes the output signal PPROG of the NAND circuit using the signals at nodes N40 and N41 as gate inputs to change from "H" to "L", making the output signal PC of the output-stage NAND circuit of the write command register circuit connected to signal PPROG change from "L" to "H".

In response to the change of signal PC, the output node N50 of the write control circuit 108-W of FIG. 12 goes a "L" level, causing signal PRO to change from "L" to "H". The signal PRO activates the write voltage circuit 212, which allows the external power supply VPP to be supplied to the chip, enabling the high voltage SW to be supplied to the internal circuit.

Furthermore, the output N21 of the NAND circuit connected to signals PPROG and PRO in the protect control circuit 215 of FIG. 14 is kept at a "H" level, which places node N23 at a "L" level, node N24 at a "H" level, nodes N25 and N26 at a low level, and the output node N27 of the next-stage inverter circuit at a "H" level. At this time, because the high voltage SW is supplied to one end of a p-channel MOS transistor constituting an inverter circuit, a high voltage is applied to node N27. At the same time, for instance, a high voltage generated by the protect cell write circuit 301 to which the external power supply VPP, signal PPROG and output signal BS1 of block decoder circuit 218 are inputted is supplied to node PBB1, which causes data "0" to be written in the protect cell 206-1. At this time, in the other protect cells 206-2 to 206-n, block select signal BS2 to BSn are in the unselected state of a "L" level. As a result, the protect cell write circuits 303 and 305 are not activated, and therefore data is not written in protect memory cells 206-2 to 206-n.

Next, means of erasing the data from or resetting the protect cells will be described. The protect resetting mode can also be set by the command control system. First, at the same time when data is written in the protect cell, a high voltage (e.g., 12 V) is externally applied to NC pin to make signal /PH "L".

In the first step of the command started by external control signals /CE and /WE, specific command signals in the protect reset mode (the "H" signals of $D_0C$ to $D_nC$ and $/D_0C$ to $/D_nC$) are transferred from external signals $I/O_0$ to $I/O_n$ via the input/output buffer circuit 211 to the command register circuit 207. At the same time, the command register 207 receives a "L" signal /PH from the high-voltage sensing circuit 214. As a result, the protect erase command register circuit 107E2 of FIG. 9 is activated. The output signal PERAS becomes high in the initial state, and the output signal EC of the erase command register circuit to which signal PERAS is supplied becomes "L". Further, because signal PPROG is "H" in the initial state and signal PRO and signal ERA both remain "L", the output node N21 of the NAND circuit in the protect control circuit 215 of FIG. 14 is at a "H" level, which places node N23 in the next stage at a "L" level and node N27 via an inverter circuit at a "H" level.

Because the protect cell has been selected but the protect sense amplifier circuit 217 is not activated, signal POUT1 is "L" and consequently output signal PROTECT is "L". In the second step of the command, the output signal PERAS of the protect erase command register circuit changes from "H" to "L", and the output signal EC of the erase command register circuit changes from "L" to H" . In response to the change of signal EC, the N60 of the erase control circuit of FIG. 12 goes to a "L" level, causing signal ERA to change from "L" to "H". Because the output signal PERAS of the protect erase command register circuit does not activate the erase voltage circuit 212, the external power supply VPP is not supplied to the chip, and consequently the high voltage VSO is not supplied to the internal circuit either. At this time, as shown in FIG. 14, the output N22 of the inverter circuit that has received the change of signal ERA in the protect control circuit 215 changes from "H" to "L", which causes the output N23 of the NAND circuit using the signals at nodes N22 and N21 as gate inputs to go to a "H" level, making output node N27 go to a "L" level. As a result, the control gates of protect cells 216-1 to 216-n are brought into the unselected state. At the same time, signal PERAS and the output signal BS1 of the block decoder circuit 218 go "H", which allows a high voltage generated by the external power supply VPP supplied to the activated protect erase circuit 302 to be applied to the source of the protect cell 216-1, thereby erasing the data in the protect cell 216-1.

Explained next will be means for judging whether or not data can be written into or erased from memory cell array blocks 206-1 to 206-n by reading the data from protect cells 216-1 to 216-n under external control to judge which one of the memory cell array blocks 206-1 to 206-n in the memory cell array block is in the protect set mode or in the protect rest mode.

In the protect cell read command register circuit of FIG. 10, when the control signal changes from "H" to "L" in the first step of the command started by external control signals /CE and /WE, activating the chip, a specific command signal to read data from the protect cell is supplied from external signals $I/O_0$ to $I/O_n$ via the input/output buffer circuit 211 to the NAND circuit 15, whose output node N71 then goes to a "L" level, making N75 go to a "H" level.

At this time, signal PPROG is "H", signal PRO is "L", and signal ERA is "L". In the protect control circuit 215 of FIG. 14 connected to these signals, the output node N21 of the NAND circuit goes to a "H" levels, the output node N22 of the inverter goes to a "H" level, node N23 goes to a "L" level, and node N27 via an inverter circuit goes to a "H" level. As a result, the protect cells 216-1 to 216-n are selected. The data in the individual protect cells are transferred to the protect sense amplifier circuit 217 via PBB1 to PBBn. At this time, as shown in FIG. 15, one of the protect block sense amplifier circuits 217-1 to 217-n in the protect sense amplifier circuit 217 is selected according to the output signals BS-1 to BS-n of the block decoder circuit 218. When the data in the protect cell is in the write mode (the protect set mode) and the protect block sense amplifier circuit 217-1 is selected according to signal BS1, POUT1 is "H" and POUT2 to POUTn are "L". Conversely, when it is in the erase mode, or the protect reset mode, POUT1 is "L".

Then, when external control signal changes from "L" to "H", a p-channel MOS transistor TR31 and an n-channel MOS transistor TR37 change from a nonconductive state to a conductive state. As a result, a "H" level at node N75 in FIG. 10 causes node 76 to go to a "H" level, placing node N77 at a "L" level, node N78 at a "H" level, and node N79 at a "L" level through the respective inverters. Consequently, the output signal SRE of the protect cell read command register circuit goes "H". The signal SRE makes the node N34 of the protect sense amplifier circuit 217 go to a "L" level. The output node N35 of the NOR circuit using the signal at node N32 and POUT1 to POUTn as gate inputs goes to a "L" level if POUT1 is "H". Then, node N36 via an inverter circuit goes to a "H" level, and signal PDS goes low. In this state, when the data in the selected protect cell is in the write mode, a "0" is outputted via the input/output buffer circuit 211 connected to the selected cell, making it possible to check the protect set mode from the outside. Further, when POUT1 to POUTn go "L", which places node N35 at a "H" level, making signal PDS go "H". In this state, when the data in the selected protect cell is in the erase mode, a "1" is outputted via the input/output buffer circuit 211 connected to the selected cell, making it possible to check the protect reset mode from the outside.

As described above, when the memory cell array is divided into blocks, a write/erase disable function to protect the data in the memory cells is provided in each block. This prevents the destruction of the data in the memory cells in the protect set mode in which writing and erasing are disabled, even if an erroneous command is taken in due to power noise or command noise during command input, causing a malfunction. In addition, the operating margin is also increased, improving the reliability.

A method of writing and erasing data into or from the memory cells is not limited to the injection of hot electrons from the drain and the Fowler Nordheim tunneling method mentioned above. For instance, another method is to use a high electric field to cause the Fowler Nordheim tunnel effect at the source with a negative high voltage applied to the control gate, the drain left open, and a low voltage applied to the source. Still another method is to write and erase data by using the Fowler Nordheim tunneling method at the channel portion of the memory cell. The high-voltage sensing circuits 114 and 214 may receive the signal from not only the NC pin but also the address pins.

As has been described above, with the present invention, use of means for controlling the write and erase modes according to the information in an electrically erasable programmable nonvolatile memory prevents the destruction of the data in the memory cells, even if an erroneous command is taken in due to power noise or command noise during command input, causing a malfunction. In addition, the operating margin is also increased, improving the reliability.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electrically programmable semiconductor memory device comprising:
   memory cell array means composed of electrically programmable nonvolatile memory cells;
   memory peripheral circuit means for specifying an address according to an external signal for said memory cell array means and performing an access operation;
   high-voltage supplying means for data program-related control of said memory cell array means;
   command register circuit means for supplying a command signal for performing a programmed operation to said memory cell array means according to an external control signal;
   command signal transfer means for controlling said memory peripheral circuit to perform at least one of a programmed and a reading operation on a given memory cell in said memory cell array means according to said command signal;
   nonvolatile protect memory means from which data is read whenever a programmed operation is performed on said memory cell array means;
   sensing means for supplying to said command register circuit means a control signal used when a programmed operation is performed on said protect memory means;
   protect sense amplifier circuit means for reading data from said protect memory means;
   protect control circuit means for controlling said protect memory means and said protect sense amplifier circuit means on the basis of the command signal from said command register circuit means; and
   control circuit means for controlling said high-voltage supplying means to control a programmed operation on said memory cell on the basis of the readout data from said protect sense amplifier circuit means.

2. An electrically programmable semiconductor memory device according to claim 1, wherein said memory cell array means is divided into memory cell array blocks, each of which is provided with said protect memory means.

3. An electrically programmable semiconductor memory device according to claim 1, wherein said memory cell array means is divided into memory cell array blocks, each of which is provided with said protect memory means.

4. An electrically programmable semiconductor memory device according to claim 2, further comprising block decoder means for accessing each of said memory cell array blocks.

5. An electrically programmable semiconductor memory device according to claim 1, wherein said command register circuit means contains protect command register circuit means for controlling said protect memory means.

6. An electrically programmable semiconductor memory device according to claim 5, wherein said protect command register circuit means contains a first and a second protect command register circuit for performing programmed operations including a writing and an erasing operation and a third protect command register circuit for performing a reading operation, on said protect memory means.

7. An electrically programmable semiconductor memory device according to claim 1, wherein said protect memory means is composed of a single nonvolatile transistor.

8. An electrically programmable semiconductor memory device according to claim 1, wherein said sensing circuit means is activated when applied with a high-voltage signal from an external pin.

9. An electrically programmable semiconductor memory device according to claim 8, wherein said external pin is a pin other than address pins.

10. An electrically programmable semiconductor memory device according to claim 8, wherein said external pin is an address pin.

* * * * *